(12) United States Patent
Selinidis

(10) Patent No.: US 8,961,852 B2
(45) Date of Patent: Feb. 24, 2015

(54) TEMPLATES HAVING HIGH CONTRAST ALIGNMENT MARKS

(75) Inventor: Kosta S. Selinidis, Austin, TX (US)

(73) Assignee: Canon Nanotechnologies, Inc., Austin, TX (US)

( * ) Notice: Subject to any disclaimer, the term of this patent is extended or adjusted under 35 U.S.C. 154(b) by 1057 days.

(21) Appl. No.: 13/021,461

(22) Filed: Feb. 4, 2011

(65) Prior Publication Data

US 2011/0192302 A1 Aug. 11, 2011

Related U.S. Application Data

(60) Provisional application No. 61/301,895, filed on Feb. 5, 2010.

(51) Int. Cl.
*G03F 7/00* (2006.01)
*B82Y 10/00* (2011.01)
*B82Y 40/00* (2011.01)

(52) U.S. Cl.
CPC ............. *G03F 7/0002* (2013.01); *B82Y 10/00* (2013.01); *B82Y 40/00* (2013.01); *Y10S 977/887* (2013.01)
USPC ........... 264/293; 264/319; 264/40.1; 977/887

(58) Field of Classification Search
None
See application file for complete search history.

(56) References Cited

U.S. PATENT DOCUMENTS

| | | | |
|---|---|---|---|
| 5,477,058 A | 12/1995 | Sato | |
| 6,696,220 B2 | 2/2004 | Bailey et al. | |
| 6,842,229 B2 | 1/2005 | Sreenivasan et al. | |
| 6,873,087 B1 | 3/2005 | Choi et al. | |
| 6,916,584 B2 | 7/2005 | Sreenivasan et al. | |
| 6,921,615 B2 | 7/2005 | Sreenivasan et al. | |
| 6,932,934 B2 | 8/2005 | Choi et al. | |
| 6,936,194 B2 | 8/2005 | Watts | |
| 7,027,156 B2 | 4/2006 | Watts et al. | |
| 7,070,405 B2 | 7/2006 | Sreenivasan et al. | |
| 7,077,992 B2 | 7/2006 | Sreenivasan et al. | |
| 7,136,150 B2 | 11/2006 | Sreenivasan et al. | |
| 7,157,036 B2 | 1/2007 | Choi et al. | |
| 7,179,396 B2 | 2/2007 | Sreenivasan | |
| 7,186,483 B2 | 3/2007 | Sreenivasan et al. | |
| 7,281,921 B2 | 10/2007 | Watts et al. | |
| 7,309,225 B2 | 12/2007 | McMackin et al. | |
| 7,396,475 B2 | 7/2008 | Sreenivasan | |
| 7,510,388 B2 * | 3/2009 | Terasaki et al. | 425/174.4 |
| 7,780,893 B2 | 8/2010 | Sreenivasan et al. | |
| 7,785,526 B2 | 8/2010 | Voisin | |
| 7,837,907 B2 | 11/2010 | Nimmakayala et al. | |
| 8,012,395 B2 * | 9/2011 | Selinidis et al. | 264/293 |
| 2003/0180631 A1 | 9/2003 | Shiota et al. | |
| 2004/0065252 A1 | 4/2004 | Sreenivasan et al. | |
| 2004/0065976 A1 | 4/2004 | Sreenivasan et al. | |
| 2005/0064344 A1 | 3/2005 | Bailey et al. | |
| 2005/0067379 A1 | 3/2005 | Sreenivasan et al. | |
| 2005/0146721 A1 | 7/2005 | Consolini et al. | |

(Continued)

FOREIGN PATENT DOCUMENTS

EP 1760526 A1 3/2007
JP 60111425 6/1985

(Continued)

*Primary Examiner* — Benjamin Schiffman
(74) *Attorney, Agent, or Firm* — Cameron A. King

(57) ABSTRACT

Described are systems and methods for formation of templates having alignment marks with high contrast material. High contrast material may be positioned within recesses of alignment marks.

17 Claims, 8 Drawing Sheets

(56) References Cited

U.S. PATENT DOCUMENTS

| | | |
|---|---|---|
| 2005/0187339 A1 | 8/2005 | Xu et al. |
| 2005/0271955 A1 | 12/2005 | Cherala et al. |
| 2006/0114450 A1 | 6/2006 | Nimmakayala et al. |
| 2007/0243655 A1 | 10/2007 | Schmid et al. |
| 2008/0067721 A1 | 3/2008 | Yu et al. |
| 2009/0148032 A1 | 6/2009 | Schumaker et al. |
| 2009/0250840 A1 | 10/2009 | Selinidis et al. |
| 2010/0092599 A1 | 4/2010 | Selinidis et al. |

FOREIGN PATENT DOCUMENTS

| | | |
|---|---|---|
| WO | WO/2005/040932 | 5/2005 |
| WO | WO/2010/042140 | 4/2010 |
| WO | WO/2010/042230 | 4/2010 |
| WO | WO/2011/072897 | 10/2010 |

* cited by examiner

TEMPLATES HAVING HIGH CONTRAST ALIGNMENT MARKS

CROSS-REFERENCE TO RELATED APPLICATIONS

The present application claims priority to U.S. Provisional Application No. 61/301,895 filed Feb. 5, 2010, which is hereby incorporated by reference in its entirety.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference herein.

An imprint lithography technique disclosed in each of the aforementioned U.S. patent publications and patent includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

SUMMARY OF INVENTION

Templates and substrates having alignment marks having high contrast materials, and methods and systems for patterning and using such templates, are provided.

In one aspect, an imprint nano-lithography substrate is patterned. Protrusions and recessions are formed onto an alignment area and a feature area of the substrate, and a high contrast material is deposited over at least the alignment area. A layer is then formed on the alignment and feature areas. A portion of the formed layer is then removed from the alignment area, such that the remaining portion of the formed layer remains only in recessions of the alignment area. Likewise, a portion of the high contrast material is removed from the alignment area, such that the remaining portion of the high contrast material remains only in the recessions of the alignment area. The remaining portion of the formed layer in the recessions of the alignment area is then removed to expose the high contrast material that remains in the recessions of the alignment area.

In other aspects the high contrast material can be deposited on the feature area and/or the formed layer or high contrast material can be removed from the feature area. In another aspect, the formed layer can have a first thickness over the alignment area and a second thickness over the feature area, with the first thickness greater than the second thickness.

In further aspects, the formed layer can be formed by dispensing a polymerizable material on the substrate, contacting the polymerizable material with an imprint template, and solidifying the polymerizable material. In other aspects, the imprint template can be transparent at that area of the template in superimposition with the alignment area and substantially opaque at that area of the template in superimposition with the feature area, such that irradiating the polymerizable material solidifies the polymerizable material on the alignment area but the polymerizable material is not or only partially polymerized at the alignment area, thus easing its later removal. In yet other aspects, the formed layer can be formed using spin-on processes.

In other aspects, the formed layer is patterned. In yet other aspects, formed layer can be made of at least two different layers having different etching rates. In other aspects, one of the layers is a planarized layer whereas another layer is a patterned layer. In further aspects, a hard mask can be disposed between the different layers.

In further aspects, an imprint template is provided having a body and a mold having a patterned surface positioned on one side of the body. The mold has a patterned surface having a feature area and an alignment mark, with the alignment mark being outside of the feature area. The alignment mark includes a plurality of protrusions and recessions with high contrast material located solely in the recessions.

In one aspect, the high contrast material of the template has a different refractive index that that of the template body. In other aspects, a protective layer is located within the recessions and over the high contrast material.

Aspects and implementations described herein may be combined in ways other than described above. Other aspects, features, and advantages will be apparent from the following detailed description, the drawings, and the claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

DETAILED DESCRIPTION

Figure 1:
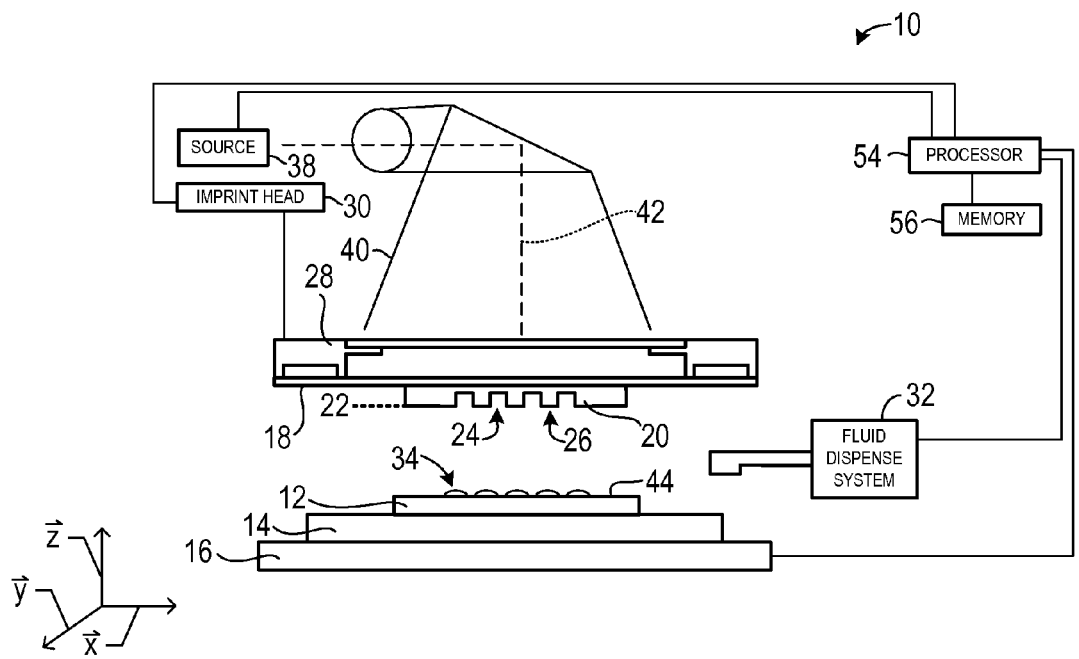
FIG. 1 illustrates a simplified side view of a lithographic system.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide translational and/or rotational motion along the x, y, and z-axes. Stage 16, substrate 12, and substrate chuck 14 may also be positioned on a base (not shown).

Spaced-apart from substrate 12 is template 18. Template 18 may include a body having a first side and a second side with one side having a mesa 20 extending therefrom towards substrate 12. Mesa 20 having a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations (e.g., planar surface). Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference herein. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit formable material 34 (e.g., polymerizable material) on substrate 12. Formable material 34 may be positioned upon substrate 12 using techniques such as drop dispense, spin-coating, dip coating, chemical vapor deposition (CVD), physical vapor deposition (PVD), thin film deposition, thick film deposition, and/or the like. Formable material 34 may be disposed upon substrate 12 before and/or after a desired volume is defined between mold 22 and substrate 12 depending on design considerations. Formable material 34 may be functional nano-particles having use within the bio-domain, solar cell industry, battery industry, and/or other industries requiring a functional nano-particle. For example, formable material 34 may comprise a monomer mixture as described in U.S. Pat. No. 7,157,036 and U.S. Patent Publication No. 2005/0187339, both of which are herein incorporated by reference. Alternatively, formable material 34 may include, but is not limited to, biomaterials (e.g., PEG), solar cell materials (e.g., N-type, P-type materials), and/or the like.

Figure 2:
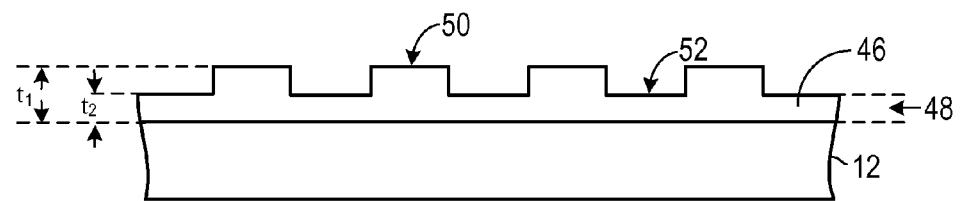
FIG. 2 illustrates a simplified side view of the substrate illustrated in FIG. 1, having a patterned layer thereon.

Referring to FIGS. 1 and 2, system 10 may further comprise energy source 38 coupled to direct energy 40 along path 42. Imprint head 30 and stage 16 may be configured to position template 18 and substrate 12 in superimposition with path 42. System 10 may be regulated by processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by formable material 34. For example, imprint head 30 may apply a force to template 18 such that mold 20 contacts formable material 34. After the desired volume is filled with formable material 34, source 38 produces energy 40, e.g., ultraviolet radiation, causing formable material 34 to solidify and/or cross-link conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$.

The above-mentioned system and process may be further employed in imprint lithography processes and systems referred to in U.S. Pat. No. 6,932,934, U.S. Pat. No. 7,077,992, U.S. Pat. No. 7,179,396, and U.S. Pat. No. 7,396,475, all of which are hereby incorporated by reference in their entirety.

Alignment marks may aid in aligning template 18 and substrate 12 prior to imprinting formable material 34 in order to facilitate pattern transfer to a precise location on the substrate. Exemplary alignment systems and processes that may aid in the facilitation of pattern transfer are further described in U.S. Pat. No. 7,837,907, U.S. Pat. No. 7,780,893, U.S. Pat. No. 7,281,921, U.S. Ser. No. 11/373,533, U.S. Pat. No. 7,136,150, U.S. Pat. No. 7,070,405, and U.S. Pat. No. 6,916,584; all of which are hereby incorporated by reference herein in their entirety. Generally, within the prior art, these alignment marks may be etched into fused silica, a medium having the similar index of refraction as formable material 34. As such, the alignment marks must remain isolated from formable material 34 in order to be visible. For example, trenches may be used to isolate alignment marks from formable material 34, as further described in U.S. Pat. No. 7,309,225, which is incorporated herein by reference. The minimum amount of space needed for a trench, however, is generally larger than a typical semiconductor scribe area. For example, the width of the trench, plus the minimum distance between alignment marks and edges needed to eliminate interference require more space than a typical scribe area.

Additionally, the provision of such trenches may result in large open spaces on substrate 12 that may be detrimental to some processes, such as chemical-mechanical planarization (CMP) and/or etching processes wherein uniformity and consistent feature density maybe significant attributes. The trench region is also a prime location for defectivity.

To alleviate the need for such trenches or large open spaces, alignment marks may be formed of high contrast materials. The high contrast materials used to form alignment marks may have different indices of refraction as formable material 34. As such, these alignment marks may be visible in the presence of formable material 34 for aligning processes.

High contrast alignment marks may be patterned in the same step as primary features of template 18. By patterning in the same step, pattern placement errors may be minimized.

These alignment marks are generally etched to substantially the same depth as the primary features formed in substrate 12.

As described in U.S. Patent Publication No. 2010/0092599, which is herein incorporated by reference, some fabrication methods of high contrast marks utilize a single or multiple layers which must be patterned during substantially the same step as the main pattern. The main pattern may include features in the 5 to 32 nm range which are very difficult to pattern transfer with the required films for high contrast align marks. Further, the composition and thickness of a hard mask best suited to form high contrast alignment marks may be different than the composition and thickness of a hard mask needed for form the primary features.

FIGS. 3A-3I illustrate an exemplary method for forming a template having alignment marks with high contrast material. The illustrated method shows the formation on substrate 12 of alignment marks with high contrast material, although it will be evident to one skilled in the art that the formed substrate would then be useful itself as a template. Patterning of alignment marks 60 and features 24a and 26a on substrate 58 may be performed in a single step. High contrast material (HCM), however, may be provided as a separate layer 62. This is advantageous as the HCM layer need not be constrained by material or composition limitations or requirements of the patterned layer. HCM layer 62 may be provided as a conformal deposition over primary pattern of features 24a and 26a. Alignment marks 60 may be shielded by a second lithography step. This second lithography step may provide selective coverage of alignment marks 60, such that after a removal process, only recesses of alignment marks 60 may include HCM.

Figure 3A:
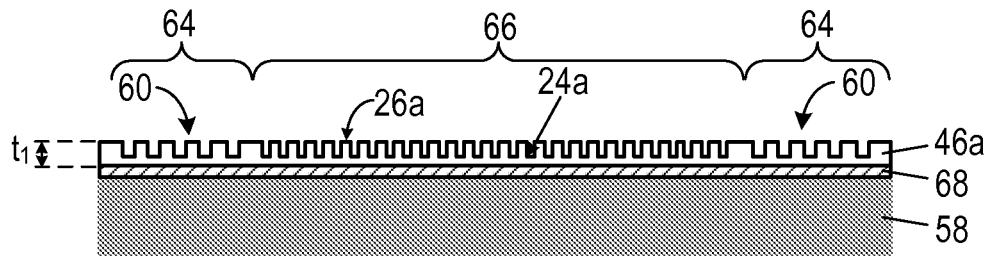
FIGS. 3A-3I illustrate an exemplary method for formation of a template having high contrast alignment marks.

Referring to FIG. 3A, substrate 58 may have formed thereon a thin hard mask 68 and a first patterned layer 46a. First patterned layer 46a may include features 24a and 26a and alignment marks 60 formed in a first lithography process. This lithography process may utilize any patterning method including but not limited to electron-beam imprinting, optical lithography, laser lithography, nanoimprint lithography, and the like. For example, using system 10 and processes described in relation to FIGS. 1 and 2. Alignment marks 60 and features 24a and 26a may have the same thickness $t_1$.

Figure 3B:
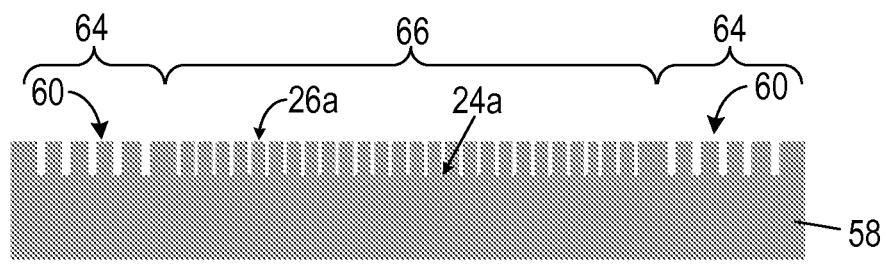

Formation of features 24a and 26a and alignment marks 60 may distinguish portions of substrate 58 into an alignment area 64 and a primary feature area 66 wherein alignment area 64 includes alignment marks 60 and primary feature area 66 includes features 24a and 26a of the primary pattern. Referring to FIG. 3B, features 24a and 26a and alignment marks 60 may be etched into substrate 58. Etching of features 24a and 26a and alignment marks 60 may be accomplished with a variety of dry etching processes known within the industry.

Figure 3C:
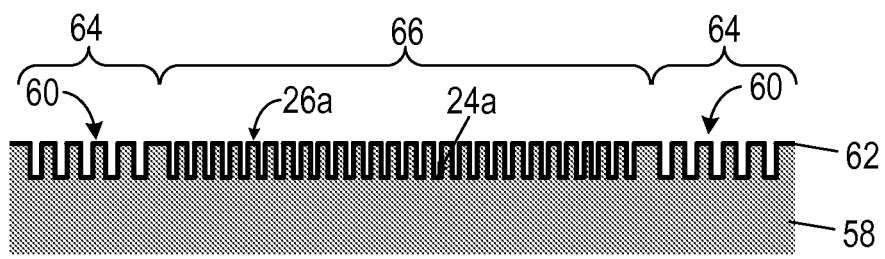

Referring to FIG. 3C and FIG. 3C-1, HCM layer 62 may be deposited over at least a portion of alignment area 64 and/or at least a portion of primary feature area 66. HCM layer 62 may be formed of materials including, but not limited to, tantalum, tungsten, silicon carbide, amorphous silicon, chromium, chromium nitride, molybdenum, molybdenum silicide, titanium, titanium nitride, and the like. HCM layer 62 may have a thickness in a range between approximately 2 nm to 50 nm.

Deposition of HCM layer 62 may be conformal or directional. For example, in one embodiment, HCM layer 62 may be directionally deposited within recesses of alignment marks 60, as illustrated in FIG. 3C-1. In another embodiment, HCM layer 62 may be conformally deposited over the entire alignment area 64 and the entire primary feature area 66, as illustrated in FIG. 3C.

In one embodiment, HCM layer 62 may be deposited over the entire patterned area including primary features area 66 and selectively removed in subsequent steps. Such selective removal may be provided without substantially affecting dimensions of features within primary feature area 66. Highly selective etch processes may be used. For example, XeF2 gas may be used as it generally is effective at removal of a-Si, Ta, TaN, MoSi, MO, and W from a fused silica surface with virtually no change to the fused silica pattern. Also, RIE $Cl_2$ or $O_2$ based dry etch processes may be used as they have shown good selectivity when removing Cr, CrN, and CrO from a fused silica surface. In addition, wet etch processes can be used to selectively remove the HCM from the fused silica such as Cr7s Chrome stripper.

FIGS. 3D-3I further illustrate a process related to conformal deposition of HCM layer 62 over the entire alignment area 64 and the entire primary feature area 66. It will be appreciated that the process is also amenable to HCM layers that are directionally deposited on the alignment area 64 and not deposited on the primary feature, as depicted in FIG. 3C-1.

Figure 3D:
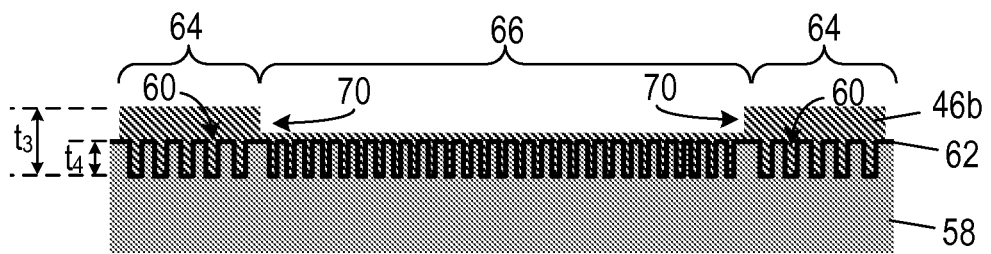
Figure 3E:
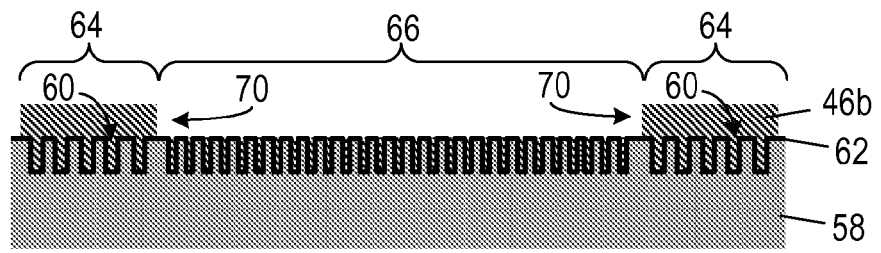
Figure 3F:
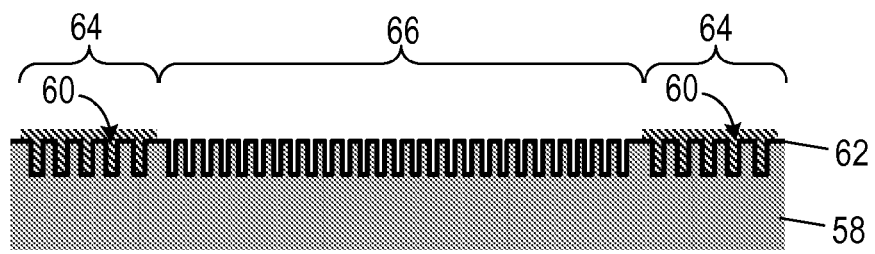
Figure 3G:
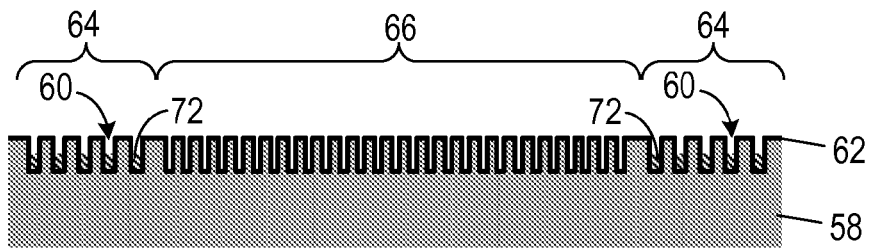
Figure 4A:
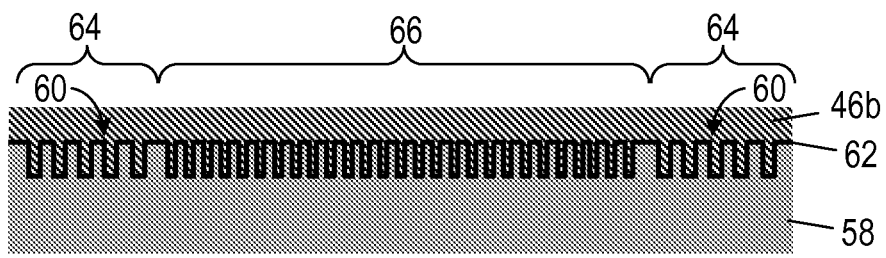
FIGS. 4A-4B illustrate another exemplary method for formation of a template having high contrast alignment marks.
Figure 4B:
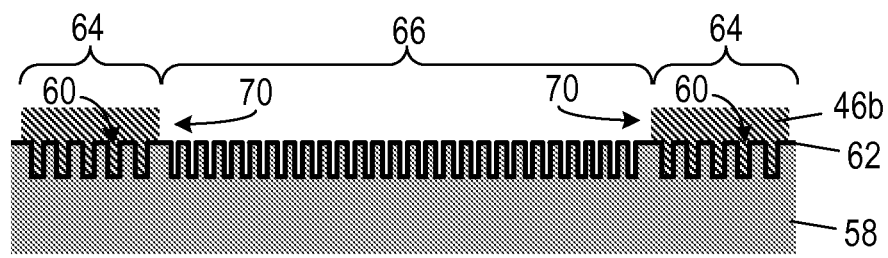

Referring to FIG. 3D, layer 46b may be formed on entire alignment area 64 and primary feature area 66 using system and processes described in relation to FIGS. 1 and 2. Layer 46b may fill features of alignment area 64 and primary feature area 66. For example, layer 46b may fill recesses of alignment marks 60. Layer 46b may have a first thickness $t_3$ over alignment area 64 and a second thickness $t_4$ over primary feature area 66. First thickness $t_3$ may be greater or substantially greater than second thickness $t_4$ forming one or more block regions 70 of formable material positioned above alignment marks 60. For example, thickness $t_3$ of layer 46b in alignment area 63 may be in a range between approximately 50 to 300 nm, and thickness $t_4$ of layer 46b in primary feature area 66 may be in a range between approximately 0 to 100 nm forming block region 70 (thickness of $t_4$ may be substantially zero as fluid dispense system 32, shown in FIG. 1, may target location of alignment area 64). Alternatively, other lithography methods can be employed to form layer 46b and block region 70. For example, layer 46b may be a planarization resist applied by spin coating over alignment area 64 and primary feature area 66, as illustrated in FIG. 4A. Block region 70 may be formed by standard lithography processing to remove layer 46b entirely from the primary feature area, as illustrated in FIG. 4B. The resist covering the alignment area may then be partially removed by etching, and the high contrast material (HCM) can be substantially removed except for the recesses of the alignment area, as previously described.

In some cases, it may be advantageous to fill the primary feature area with a material 90 that has a more selective etching process, and may be easily removed as shown in FIGS. 5A through 5D. An example of when this may be advantageous is if the material in the main feature area is more difficult to remove due to the significantly higher aspect ratios in the primary feature area as compared to the alignment areas. In this case, a first layer of material 90 is applied to the main features and a second material 46c is patterned to cover the alignment area. The first material is then removed from the primary feature area completely before the second layer over the alignment area is consumed. The removal of the first and second material may continue until only the recesses of the alignment area are protected similar to FIG. 3H.

FIGS. 6A-6E show yet another method possible for adding even more protection over the alignment area. In this case the alignment area is protected by a patterned material 46c and a temporary hard mask 100. The material 90 covering the primary feature area is then removed completely with full protection over the alignment area. The temporary hard mask must then be removed and the material covering the align mark may be processed similarly to FIG. 3F-3I.

Figure 5A:
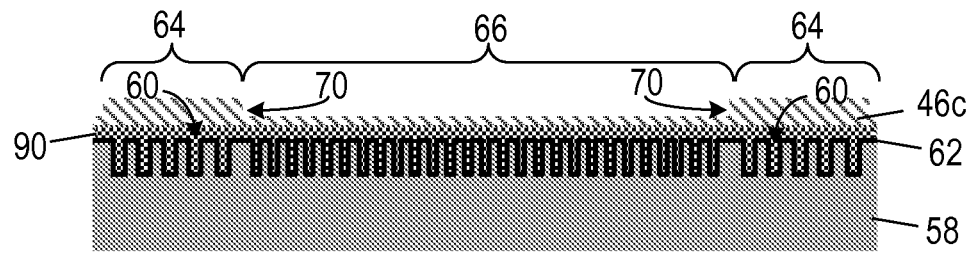
FIGS. 5A-5D illustrate another exemplary method for formation of a template having high contrast alignment marks.
Figure 5B:
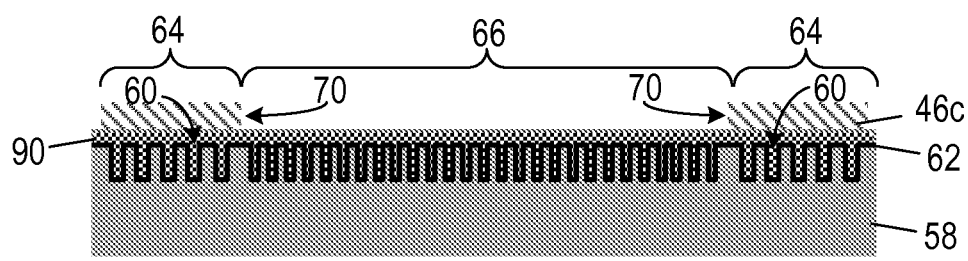
Figure 5C:
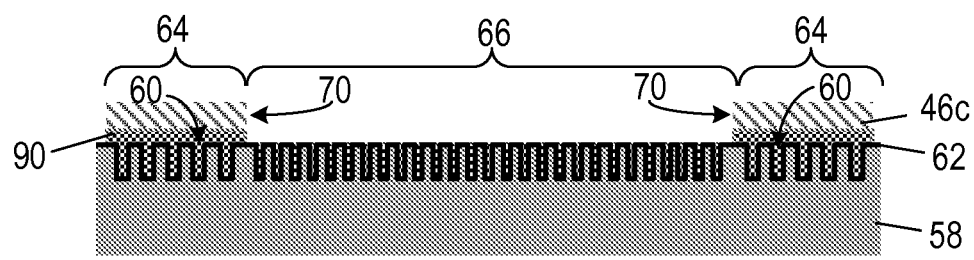
Figure 5D:
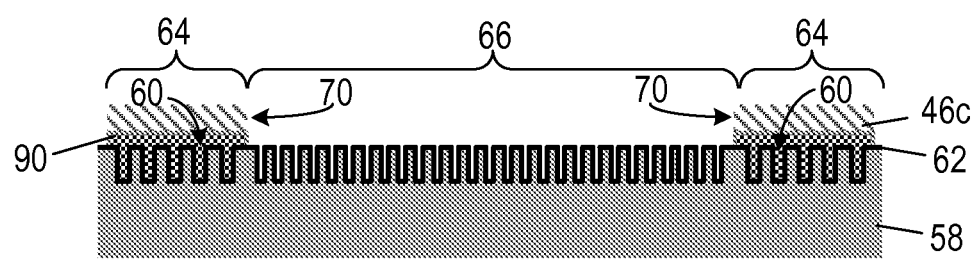
Figure 6A:
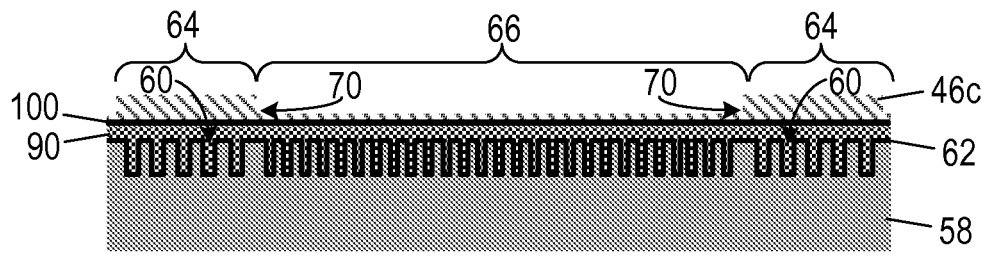
FIGS. 6A-6E illustrate another exemplary method for formation of a template having high contrast alignment marks.
Figure 6B:
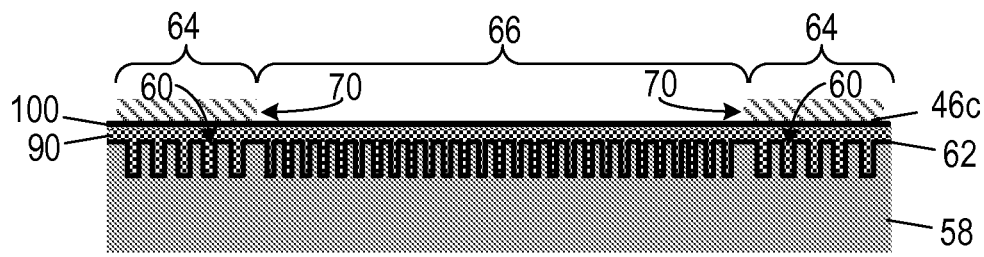
Figure 6C:
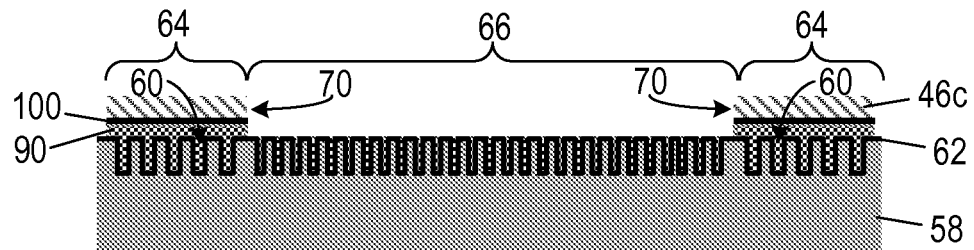
Figure 6D:
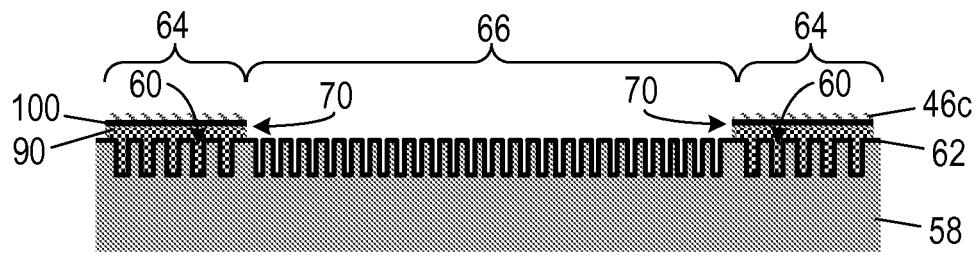
Figure 6E:
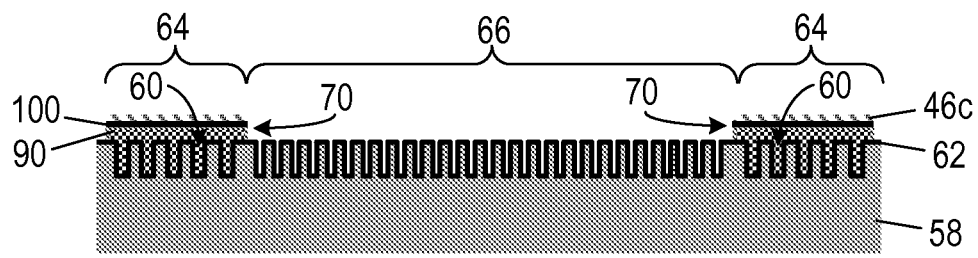

Generally, methods provided in FIGS. 5A and 5B, as well as FIGS. 4A and 4B, may feature spin-on resist, bake, and development processes. Layer 46c may be applied to alignment area 64 and patterned area 66 within layer 46c having a substantially uniform thickness. Block region 70 may be formed by subsequent removal of portions of layer 46c. It should be noted that block region 70 may be formed by other techniques including, but not limited to, imprinting, contact printing, proximity printing, reduction printing, laser writing, e-beam writing, and the like.

Figure 3H:
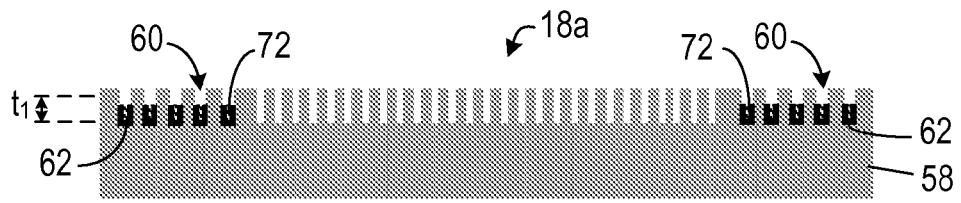
Figure 3I:
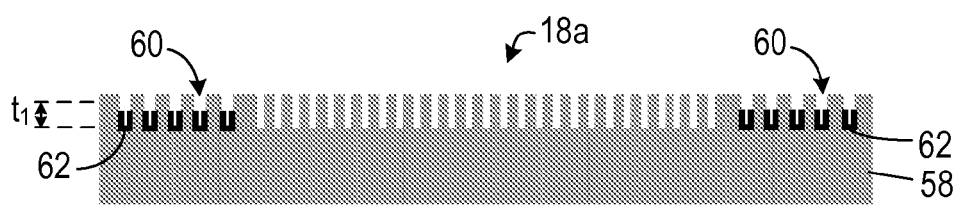
Figures 1, 3C:
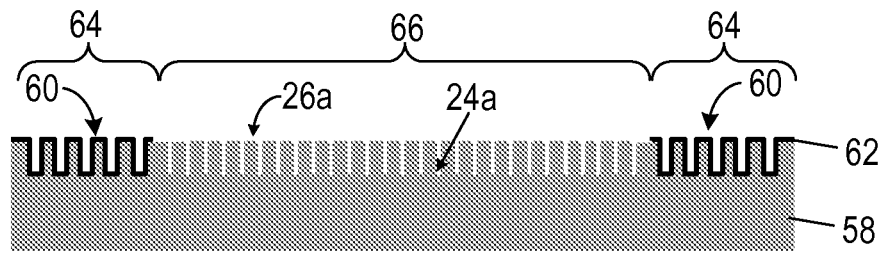

Block region 70 may provide additional shielding of alignment marks 60 during subsequent removal of portions of layer 46b. For example, as illustrated in the step-wise removal of layer 46b (e.g., descum etching) in FIGS. 3E-3G during the second lithography process provides selective coverage of alignment marks 60. The selective coverage may result in a residual material layer 72 within recesses of alignment marks 60. Portions of HCM layer 62 not blocked by residual material layer 72 may then be stripped as illustrated in FIG. 3H. Additionally, residual material layer 72 may be removed, forming alignment marks 60 having HCM layer 62 positioned solely within recesses of alignment marks 60, as illustrated in FIG. 3I. Alignment marks 60 and features 24a and 26a may have the same thickness $t_1$.

Figure 8:
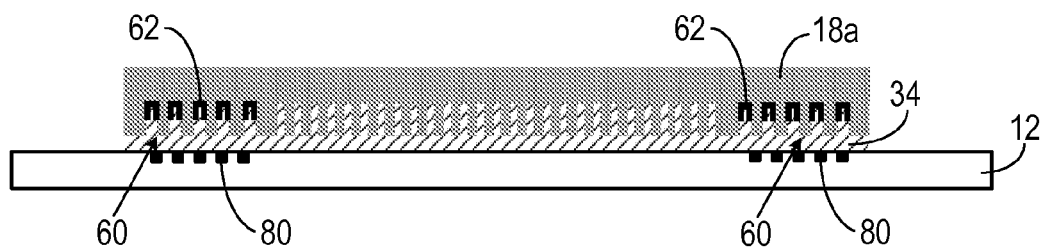
FIG. 8 illustrates an exemplary use of a template formed in accordance with the methods of FIGS. 3-7.

Substrate 58 of FIG. 3I may be used as a template for imprinting. FIG. 8 illustrates an exemplary imprinting process using a template with mold 18a that has alignment marks 60 containing HCM layer 62 solely in the recesses of the alignment marks. The imprinting process may be similar to processes described in relation to FIGS. 1 and 2. Formable material 34 fills gap between mold 18a and substrate 12. HCM layer 62 provides visibility with regard to alignment marks 60 in aligning template 18a with substrate 12 using substrate alignment marks 80.

Alignment marks 60 with HCM layer 62 positioned within recesses may provide enough visibility to perform alignment even with alignment marks 60 embedded within formable material 34 during imprinting as described in relation to FIGS. 1 and 2. As such, alignment marks 60 may not need to be isolated from formable material 34, such as through e.g. trenches or other large openings. The elimination of such fluid barrier features may substantially reduce overall imprint scribe width, provide flexibility for integration into existing semiconductor processing, reduce issues regarding CMP and etching uniformity, and/or the like. Also, because the HCM layer is within the recesses of the alignment mark, rather than being present as a layer at the surface or on protrusions of the alignment mark, the HCM layer does not interfere with the desired spacing or gap between the template and the substrate during imprinting. This allows for imprinting patterns with minimal residual layer thickness. And as previously mentioned, because the HCM layer does not need to be patterned with the main pattern, the composition of the HCM need not be constrained by performance characteristics required of the main pattern materials.

Figure 9A:
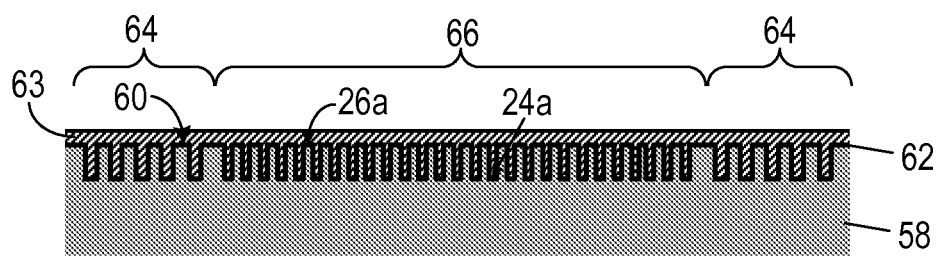
FIGS. 9A-9B illustrate another exemplary method for formation of a template having high contrast alignment marks.
Figure 9B:
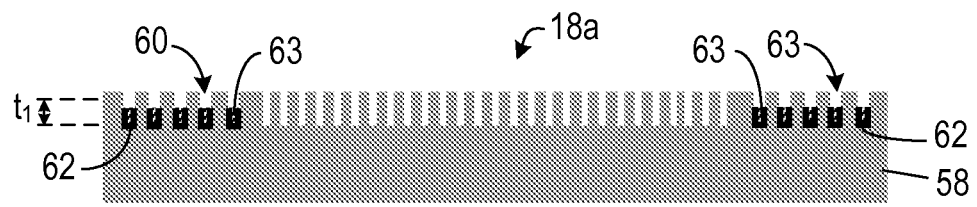

To prolong the useful life of template 18a, a protective layer can further be formed over the HCM layer within the recesses to protect the HCM layer from degradation when the template is used for imprinting, or when it is subjected to cleaning, and the like. The protective layer can be formed of an oxide or nitride layer, such as $SiO_2$, $SiN_2$, or $Al_2O_3$, or the like, or it can be formed of amorphous Si or SiC, or the like. The protective layer can be formed over HCM layer 62 prior to forming layer 46, as depicted in FIG. 9A, and then partially removed through subsequent processing such that remaining protective layer material resides only in the recesses of the alignment marks as shown in FIG. 9B.

FIGS. 5A-5D illustrate another method of forming HCM layer 62 within recesses of alignment marks 60. Generally, a planarization layer 90 may be positioned on alignment area 64 and primary feature area 66. Planarization layer 90 may be positioned using an imprint lithography process, spin-on process, or the like. Planarization layer 90 may have a first etching rate. Patterned layer 46c may be positioned on planarization layer 90 using techniques and systems described in relation to FIGS. 1-3. Patterned layer 46c may have a second etching rate. The first etching rate of planarization layer 90 may be higher than the second etching rate of patterned layer 46c, and as such, selective etches may be provided for each material. For example, organic materials (e.g., m BARC, PBS resists), and the like. For example, material providing 2 to 10× higher etching rate as compared to a cross-linked polymer may be used.

FIGS. 6A-6E illustrate another method of forming HCM layer 62 within recesses of alignment marks 60. Similar to FIGS. 5A-5D, planarization layer 90 may have a first etching rate and patterned layer 46c may have a second etching rate. Positioned between planarization layer 90 and patterned layer 46c may be a hard mask layer 100. Generally, hard mask layer 100 may provide shielding of alignment area 64 during removal of patterned layer 46c and/or planarization layer 90.

Figure 7:
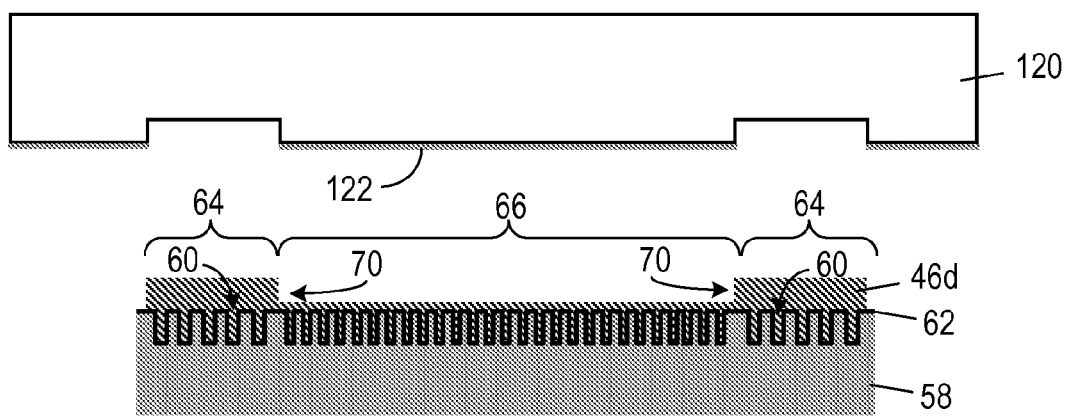
FIG. 7 illustrates a method of altering an etch rate of at least a portion of a patterned layer for formation of a template having high contrast alignment marks.

FIG. 7 illustrates another exemplary method of providing layer 46d with selective etch rates. Generally, an imprint mask 120 may be used to partially expose a portion of layer 46d. For example, imprint mask 120 may be used to partially expose primary feature area 66 of layer 46d such that layer 46d in primary feature area 66 exhibits a high etch rate as compared to layer 46d in alignment area 64. A first side of imprint mask 120 may include an illumination reduction layer 122 making the mask substantially opaque at those locations where the illumination reduction layer 122 resides while remaining transparent at other locations. Illumination reduction layer 122 may span the length of primary feature area 66 such that when layer 46d is exposed to energy, illumination reduction layer 122 reduces exposure of layer 46d within primary feature area 66, such that layer 46d solidifies within the alignment marks 60 when exposed to radiation but layer 46d does not substantially solidify. Selective illumination reduction may thus increase the etch rate of primary feature area 66. Removal techniques, such as those described herein, may subsequently be used providing alignment marks 60 having HCM layer 62 within recesses.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Changes may be made in the elements described herein without departing from the spirit and scope as described in the following claims.

What is claimed is:
1. A method of patterning an imprint nano-lithography substrate, comprising the steps of:
 (a) forming a plurality of protrusions and recessions onto an alignment area and a feature area of the substrate;
 (b) depositing high contrast material on the alignment area;
 (c) forming a layer on the alignment and feature areas;

(d) removing a portion of the formed layer from the alignment area, such that the remaining portion of the formed layer remains only in the recessions of the alignment area;

(e) removing a portion of the high contrast material from the alignment area, such that the remaining portion of the high contrast material remains only in the recessions of the alignment area; and (g) removing the remaining portion of the of the formed layer in the recessions of the alignment area to expose the high contrast material remaining in the recessions of the alignment area.

2. The method of claim 1 further comprising depositing high contrast material on the feature area.

3. The method of claim 2 further comprising removing the high contrast material from the feature area.

4. The method of claim 1 further comprising removing the formed layer from the feature area.

5. The method of claim 4 wherein the formed layer has a first thickness over the alignment area and a second thickness over the feature area, and where the first thickness is greater than the second thickness.

6. The method of claim 1 wherein the formed layer is formed by dispensing a polymerizable material on the substrate, contacting the polymerizable material with an imprint template, and solidifying the polymerizable material.

7. The method of claim 1 wherein the formed layer is formed by a spin-on process.

8. The method of claim 1 wherein the formed layer is patterned.

9. The method of claim 1 wherein the formed layer further comprises at least two different layers having different etching rates.

10. The method of claim 9 wherein one of the different layers is a planarized layer and another of the two different layers is a patterned layer.

11. The method of claim 9 further comprising a hard mask disposed between at least two of the different layers.

12. The method of claim 11 wherein one of the different layers is a planarized layer and another of the two different layers is a patterned layer.

13. A method of patterning an imprint nano-lithography substrate, comprising the steps of:

(a) forming a plurality of protrusions and recessions onto an alignment area and a feature area of the substrate;

(b) depositing high contrast material on the alignment area;

(c) forming a layer on the alignment area by dispensing a polymerizable material on the substrate, contacting the polymerizable material with an imprint template in superimposition with the alignment and feature areas, the imprint template being transparent at that area of the template in superimposition with the alignment area and substantially opaque at that area of the template in superimposition with the feature area, and irradiating the polymerizable material to solidify the polymerizable material on the alignment area;

(d) removing a portion of the formed layer from the alignment area, such that the remaining portion of the formed layer remains only in the recessions of the alignment area;

(e) removing a portion of the high contrast material from the alignment area, such that the remaining portion of the high contrast material remains only in the recessions of the alignment area; and (g) removing the remaining portion of the of the formed layer in the recessions of the alignment area to expose the high contrast material remaining in the recessions of the alignment area.

14. The method of claim 13 further comprising depositing high contrast material on the feature area.

15. The method of claim 14 further comprising removing the high contrast material from the feature area.

16. The method of claim 13 wherein the formed layer further comprises at least two different layers having different etching rates.

17. The method of claim 16 further comprising adding a hard mask between at least two of the different layers.

* * * * *